United States Patent [19]

Schachter

[11] 4,285,780

[45] Aug. 25, 1981

[54] METHOD OF MAKING A MULTI-LEVEL CIRCUIT BOARD

[76] Inventor: Herbert I. Schachter, 86 Campbell St., New Hyde Park, Long Island, N.Y. 11040

[21] Appl. No.: 957,291

[22] Filed: Nov. 2, 1978

[51] Int. Cl.³ ............................................. C25D 5/02
[52] U.S. Cl. .................................... 204/15; 156/656; 156/659.1; 427/96; 427/259; 29/830
[58] Field of Search ................ 29/625, 830; 156/656, 156/659; 427/96, 259; 357/71; 204/15

[56] References Cited

U.S. PATENT DOCUMENTS

| Re. 29,284 | 6/1977 | Shaheen et al. | 427/259 X |
|---|---|---|---|
| 3,628,999 | 12/1971 | Schneble, Jr. et al. | 29/625 X |
| 3,672,986 | 6/1972 | Schneble, Jr. et al. | 156/659 X |
| 3,673,680 | 7/1972 | Tanaka et al. | 156/656 X |
| 3,691,632 | 9/1972 | Smith | 29/625 |
| 4,076,575 | 2/1978 | Chang | 29/625 X |

FOREIGN PATENT DOCUMENTS 1536772 12/1978 United Kingdom .

*Primary Examiner*—Carl E. Hall
*Assistant Examiner*—C. J. Arbes
*Attorney, Agent, or Firm*—Lackenbach, Lilling & Siegel

[57] ABSTRACT

A multi-level printed circuit board with at least two levels of circuitry. A substrate has a first level of circuitry, an insulating covering or layer over the entire surface of the substrate and the circuitry except in first predetermined areas, a second level of circuitry is formed over said insulating covering or layer and metallurgically bonded to form electrically conductive joints at the predetermined uncovered areas with the first level of circuitry.

The method of making a multi-level printed circuit board comprises the steps of forming at least one level of circuitry on at least one side of a substrate, applying an insulating covering or layer over the entire surface of the substrate and circuitry except in a first number of predetermined areas, forming a thin adherent conductive coating over all exposed surfaces, applying a temporary mask over the conductive coating except in second predetermined areas which define the second level of circuitry on the side of said substrate, forming copper circuitry in said second predetermined areas, and removing the temporary mask and said adherent conductive coating. The formation of the second level of circuitry is repeated for as many levels as is desired, and levels of circuitry may be formed on both sides of the substrate. A final level of circuitry is formed and is covered by a final insulating coating except in final predetermined areas.

8 Claims, 25 Drawing Figures

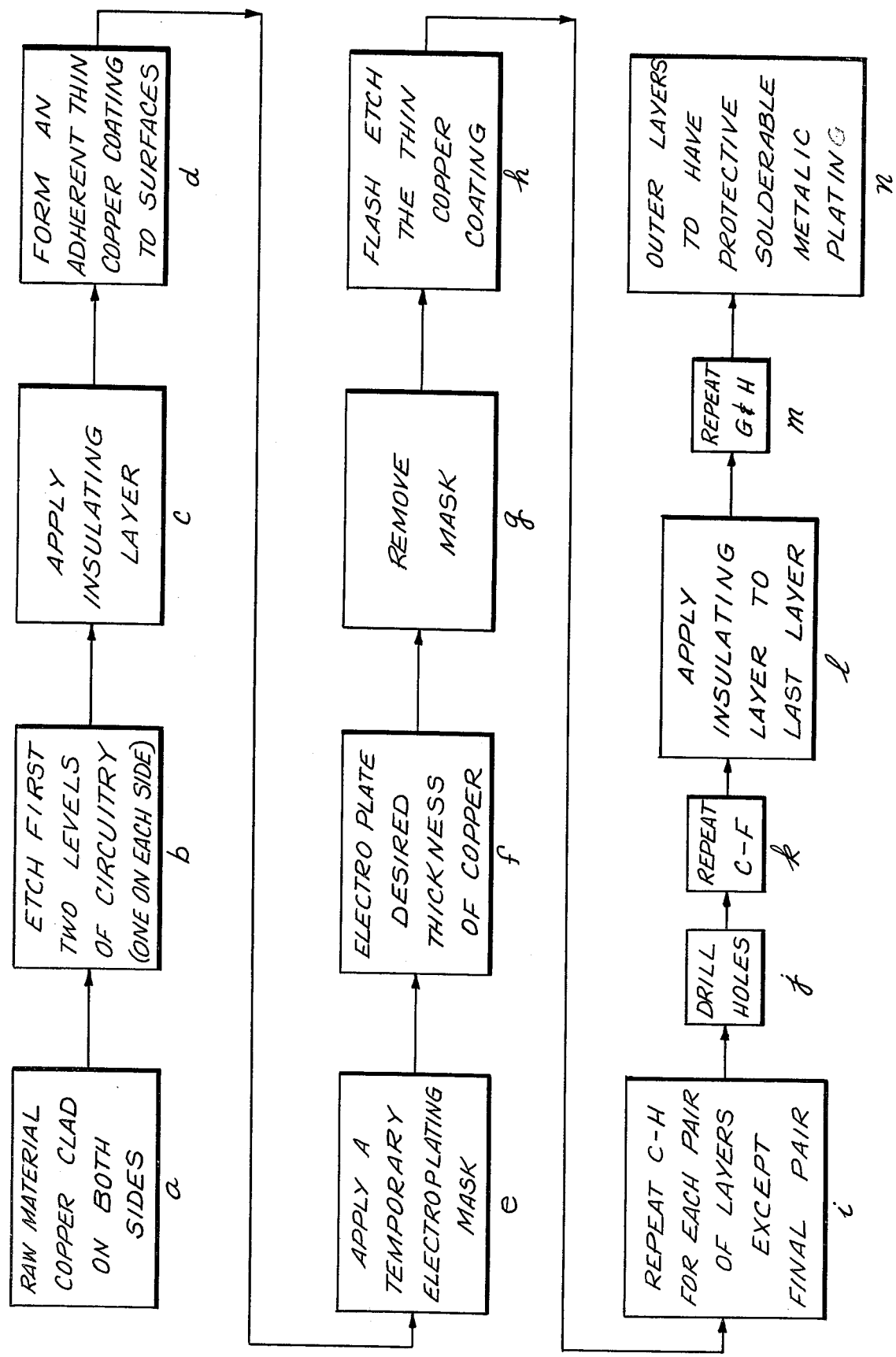

COPPER CLAD LAMINATE

LAMINATE WITH ETCHED CIRCUITS OR
CONDUCTOR PATHS - FIRST LEVEL (BOTH SIDES)

METHOD OF MAKING A MULTI-LEVEL CIRCUIT BOARD

FIELD OF THE INVENTION

This invention relates to the art of printed circuit boards and more particularly to multi-level printed circuit boards wherein a plurality of levels of circuitry are stacked in planes parallel to the plane of a single substrate. This invention also pertains to the methods for making said printed circuit boards as well as to a method for making a two-sided printed circuit board with solder mask over bare copper, but with holes solder-coated; and to the method of making a one-sided multi-level circuit board without interconnection holes from one side of the substrate to the other side thereof.

DESCRIPTION OF THE PRIOR ART

Known prior art multi-layer printed circuit boards all comprise a plurality of substrates each clad with copper on one or both sides and with the substrates bonded together to form a unitary circuit board structure under heat and pressure using an uncured epoxy glass material between the substrates. The methods of production of such multi-layer printed circuit boards are extremely complex and involved as numerous steps must be followed in order to fabricate just a single layer. Any number of layers are formed and a circuit board is completed by conventional techniques commonly used for a two-sided printed circuit board, such as drilling holes, plating through the holes, final plating and etching. As a result thereof, there exist numerous disadvantages to this type of production and the multi-level printed circuit boards of the present invention represent a distinct improvement over this type of printed circuit board construction. The prior art is further described herein in connection with FIGS. 1-3 of the drawings. As shown and noted herein, holes are drilled through predesignated or predetermined locations and the interconnections are made from layer to layer by electrolessly depositing copper into the holes and the copper is bonded to the copper edges which are exposed due to the drilled holes. Such bonding should form a circular joint around the barrel formed by the copper in the drilled hole and such joint would in cross-section occur only at those locations where the copper circuits meet a drilled hole in the various layers of a multi-layer printed circuit board. As the drilled hole is only lined with copper and not filled as a component lead is to be inserted through the drilled hole at the time the printed circuit board is assembled with its components to form a particular device, it is very fragile and can easily be shorted at one or more points or joints. It should be recognized that although military applications of printed circuit boards generally require internal copper layer thickness of anywhere from about 0.002" to about 0.003", commercial applications generally allow a thickness of half that, or about 0.001" to about 0.0015". Such thin layers of circuitry produce very thin "circular joints" and these types of joints are very susceptible to separating and causing an open circuit anywhere in an extremely expensive board construction which may have more than two layers of circuitry and which may be very large in area, covering numerous electrical circuits and hundreds of electrical components.

Examples of prior art printed circuit board constructions are shown and described in U.S. Pat. Nos. 3,366,519 to Pritchard, Jr.; 3,508,330 to Kubik; and 4,017,968 to Weglins. Although these patents are representative of existing circuit board technology, none of the patents are directed to a multilevel printed circuit board structure having "built-up" conductors produced by the electroless or electroless plus electroplated deposition of copper for each level of circuitry. United States companies who are active in the printed circuit art technology include Hazeltine Corporation, Photo-Circuits Corporation (acquired by Kollmorgan Company), I.B.M., Western Electric, R.C.A. and Bell Labs.

BRIEF DESCRIPTION OF THE DRAWINGS

FIG. 4 is a block process flow diagram illustrating the novel method of making multi-level circuit boards of the present invention;

DESCRIPTION OF THE PREFERRED EMBODIMENT

Figure 1:
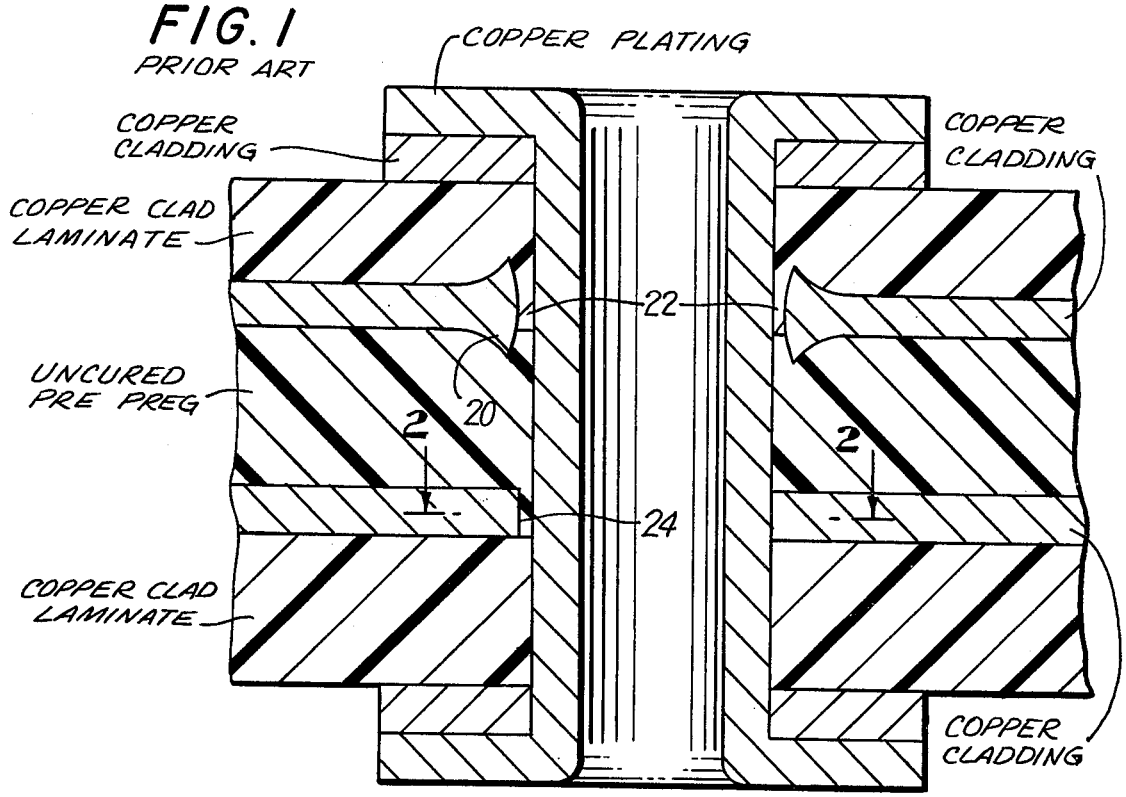
FIG. 1 is an enlarged fragmentary side elevational view in cross-section of a component lead hole in a prior art type of multilayer printed circuit board which may comprise two or more substrates or base sheets.
Figure 2:
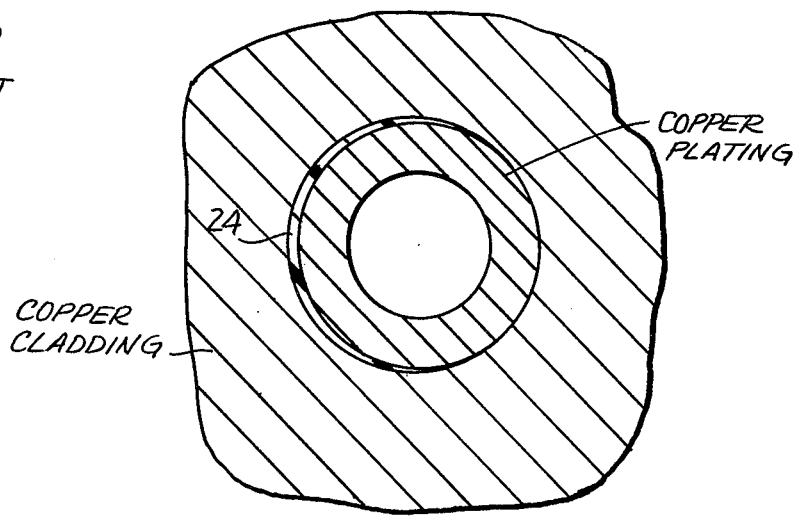
FIG. 2 is a fragmentary cross-sectional view along the line 2—2 of FIG. 1, showing an incomplete metallurgical bond about a portion of the periphery of the lead or drilled hole.
Figure 3:
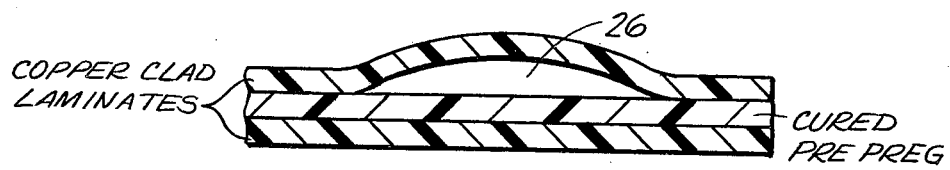
FIG. 3 is a fragmentary side elevational view in section of another incomplete bond common to the prior art multi-layer printed circuit boards where delamination occurs as a result of air and/or moisture being trapped in pockets between layers of the circuit boards.

Referring now to the drawings, and particularly to FIGS. 1-3, the prior art structures exhibited numerous defects, such as "nail heading" represented by the reference numeral 20 in FIG. 1, and smearing of the insulating material at 22 and 24. These defects preclude a good or complete metallurgical bond of the various copper layers in the multi-layer circuit device and the copper coating forming the terminal pad which is formed when a hole is drilled through the areas where copper is so provided for such purposes. FIG. 2 illustrates a typical incomplete bond about three-fourths of the peripheral circular joint or zone where the metallurgical bond is to be made for a typical layer.

In FIG. 3, a further defect is shown in the prior art constructions. As shown therein, one or more bubbles 26 are formed where delamination occurs as a result of air and/or moisture being trapped in pockets between layers or sheets of multi-layer printed circuit board materials. Prior art multi-layer printed circuit boards comprise two or more substrates each clad with a conductive coating, such as copper on one or both sides thereof, and generally have one or more sheets of an uncured epoxy glass material (ordinarily known as "pre preg") between the substrates. Such multi-layer board is cured under heat and pressure to form a unitary structure. Thereafter, the multi-layer circuit board is completed using well-known techniques of drilling, plating through the holes, final plating and etching.

The interconnections made from layer to layer in such prior are circuit boards are made by electrolessly depositing copper into the drilled holes so that copper-to-copper bonds are formed at all exposed circular copper edges generated as a result of the drilling step. This type of bond forms in effect a circular joint(s) with the copper layer(s) provided the layer(s) extending completely to the drilled hole has not been smeared with an insulating material caused by melting due to the heat of drilling. Defective boards exhibiting poor connections are very common with this type of prior art technique so that it is considered an inefficient and wasteful process, but has been tolerated for lack of better and more efficient processes.

Figure 4A:
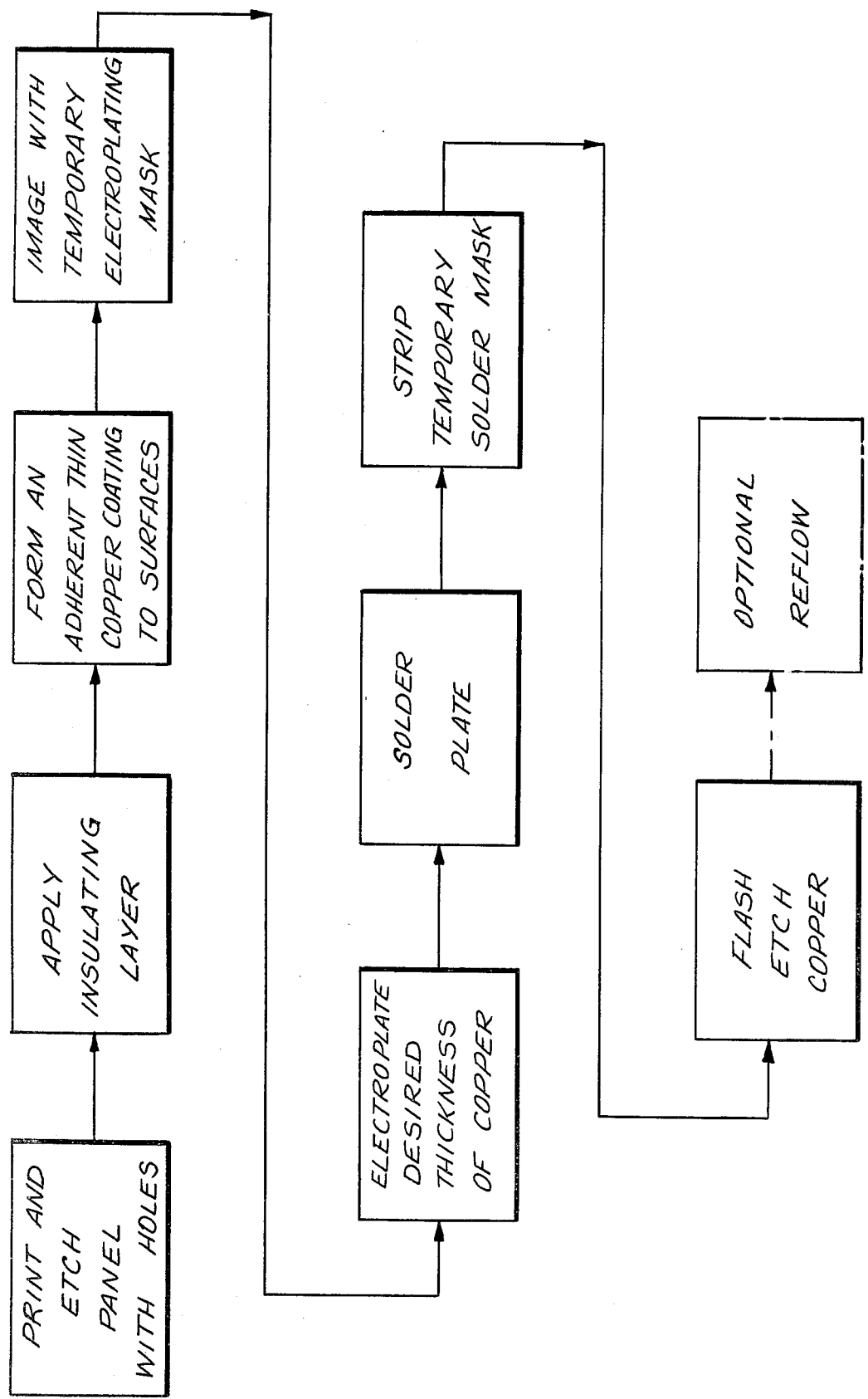
FIG. 4A is a block process flow diagram similar to that of FIG. 4, but showing a modification of the novel method of the present invention for manufacturing two-sided printed circuit boards with solder mask over bare copper, but with holes solder coated.
Figure 5:
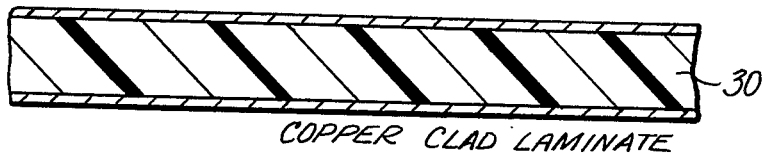
FIG. 5 is a typical cross section of a substrate or base having a first application of electroless copper deposit or cladding on both sides thereof.

In FIG. 4, a basic flow diagram of the method steps of the present invention concerning multi-level circuit boards is illustrated. FIG. 4A shows the optional variation of the invention for two-sided printed circuit boards with solder mask over bare copper, but with holes solder coated.

Figure 6:
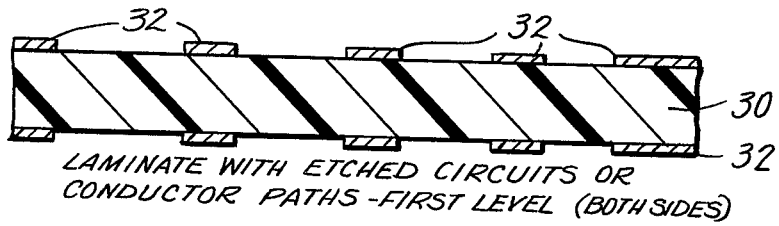
FIG. 6 is the same cross section as FIG. 5, but illustrating etched areas or areas of no copper on each side of the base or substrate.

Referring now to FIGS. 5-16, the first step of the present invention involves the use of a copper clad laminate with copper on one or both sides of a substrate 30. This type of laminate may be conventionally purchased or prepared on site. For purposes of this disclosure, the copper is shown clad to both sides in FIG. 5 and is shown in the flow diagram as block 4a. In FIG. 6, copper has been removed from the unwanted areas leaving a first level of circuitry 32 (conductive circuit paths) on each side of the base laminate or substrate 30, as shown in the flow diagram as block 4b. The most commonly known method of achieving this state is called "Print and Etch". Other well-known methods may also be used to achieve the same end result or state.

Figure 7:
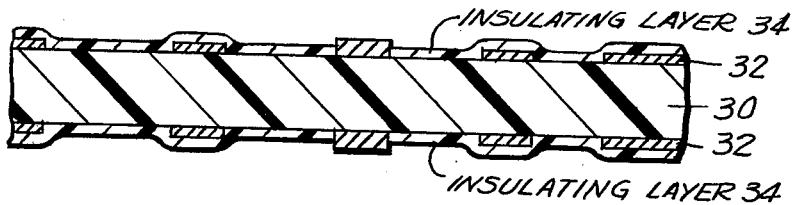
FIG. 7 is the same cross section as FIGS. 5-6, but showing an insulating film layer over both sides of the entire base or substrate including the raw exposed copper layers except for that area where the copper is to be built-up.

As best shown in FIG. 7, the entire surfaces of the laminate are coated with an insulating layer 34 except those first predetermined areas where copper-to-copper metallurgical bonds are to be made. This is also exhibited by block 4c of the flow diagram of FIG. 4. The insulating layer 34 may be applied by conventional silk screening methods or by photographic methods using photopolymers. Examples of such insulating material are a solder mask photo-polymer film, such as "RISTON", a trademark of E.I. du Pont de Nemours and Company of Wilmington, Delaware, and solder mask inks made by other manufacturers for use by silk screening methods. This insulating coating is cured by recommended procedures and after being cured is not readily removable by conventional means. In contrast thereto, the temporary mask 38 as noted hereinbelow is applied by similar means as the insulation layer and is composed of materials that are readily removable using conventional paint stripping techniques, such as the use of solvent strippers and the like. Such insulating films must be of the type which are receptive to subsequent electroless metallic deposition and they may be catalyzed if desired. The film is applied over the entire surface except all pad areas (conductor terminations) and any fingers (used on plug-in boards) and any other exposed predetermined areas where depositions are to be formed and where metallurgical bonds are to be formed.

Figure 8:
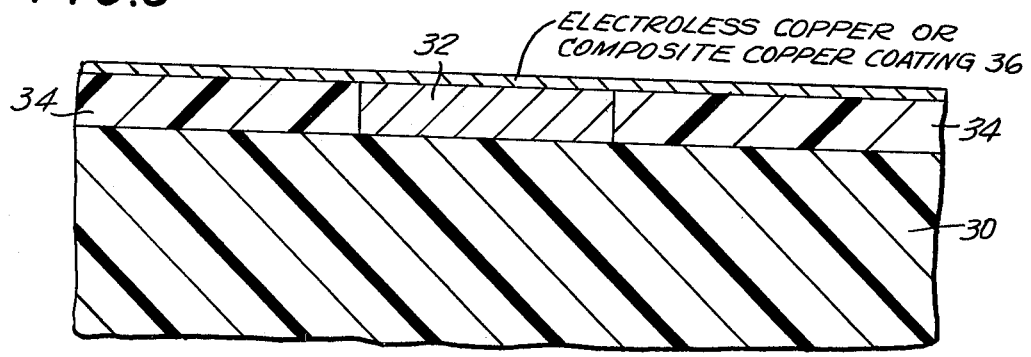
FIG. 8 is a greatly enlarged cross-sectional view of the area where the copper is to be built-up on a typical side of the base or substrate, showing a thin electroless copper coating which is applied to both sides of the entire base.

The next process step is shown in FIG. 8, which is a greatly enlarged view of an exposed copper area together with its adjacent insulating film and having a thin electroless copper coating 36 or a coating made up of a still thinner electroless copper coating reinforced by an electroplated copper, together making a thin composite copper coating. The thin copper films or coatings shown herein are generally about 1% to 10% of the thickness of the final copper thickness used for the pads and conductors. In any event, they must be thick enough to withstand all subsequent mechanical handling and chemical processing steps. Block 4d of FIG. 4 illustrates this step in the flow diagram of the present invention. A copper coating of a thickness of about 0.0001" is generally adequate for most applications. Another conventional technique for depositing a thin copper coating is called copper reduction.

Figure 9:
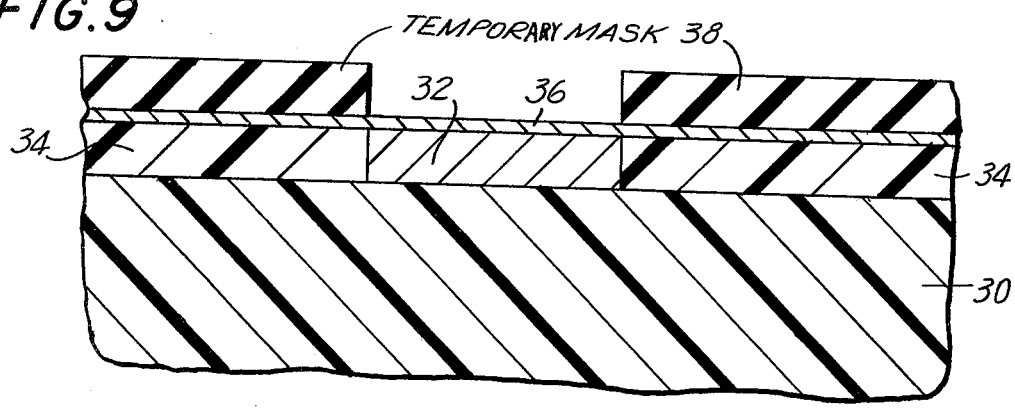
FIG. 9 is a view similar to that of FIG. 8, but showing a temporary electroplating mask provided over the entire surface area of both sides of the base or substrate, except in those areas where the copper deposit is to be built-up for forming the conductors.

As shown in FIG. 9, a temporary mask 38 is applied over the thin copper layer in all areas except in second predetermined areas where pads and conductors are to be built-up or formed. It is most common to form the pads and conductors by electroplating techniques, but there are also other well-known techniques available to accomplish the same formation of conductors and pads. Note that the temporary mask 38 is basically a paint. Block 4e of FIG. 4 shows this method step of FIG. 9 and block 4f shows the building up step for the copper.

Figure 10:
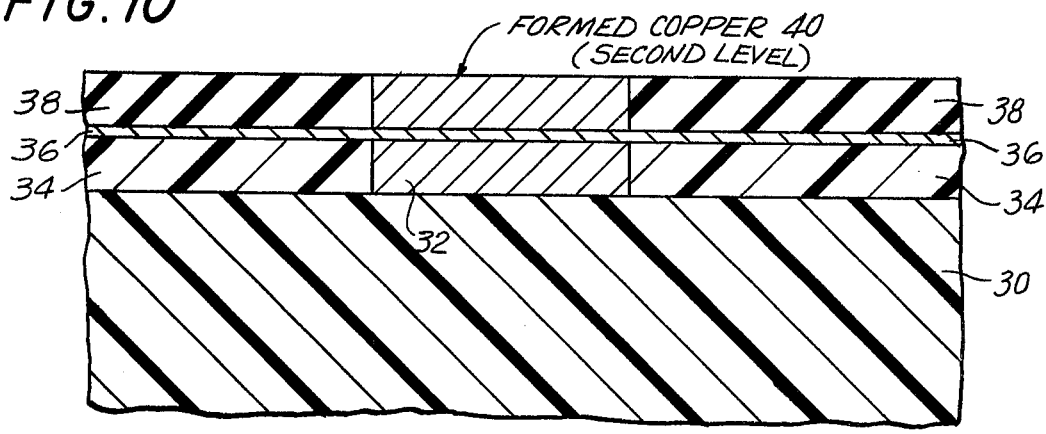
FIG. 10 is a greatly enlarged cross-sectional view of a typical side of the base or substrate, showing the method step of providing a further copper coating in the areas where conductors or terminal pads are to be built-up.

FIG. 10 illustrates the plating and/or build up and deposition of copper for the second level of circuitry 40 on each side of the base laminate or substrate, as shown in block 4f of FIG. 4. It should be appreciated that level-to-level interconnections where desired are achieved by pad building upon pad directly and solidly with no intervening insulation, thereby enhancing the reliability of the printed circuit boards by many orders of magnitude. The solder masking step is basically used to keep the conductors (each level of circuitry) in place during interim handling as the final product does not depend upon adhesion because all of the conductors are captured and in effect encapsulated by the (final) insulating layers and have sound copper-to-copper metallurgical bonds.

Figure 11:
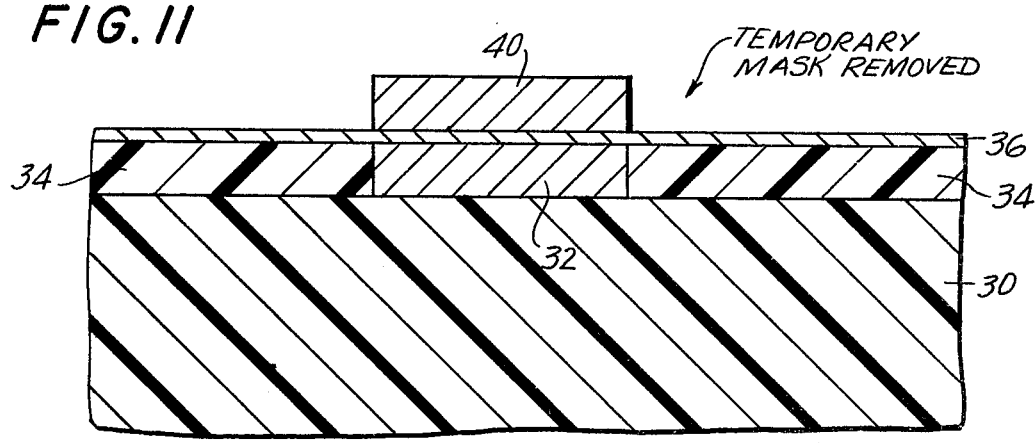
FIG. 11 is a view similar to that of FIG. 10, but illustrating removal of the temporary mask of FIG. 9.
Figure 12:
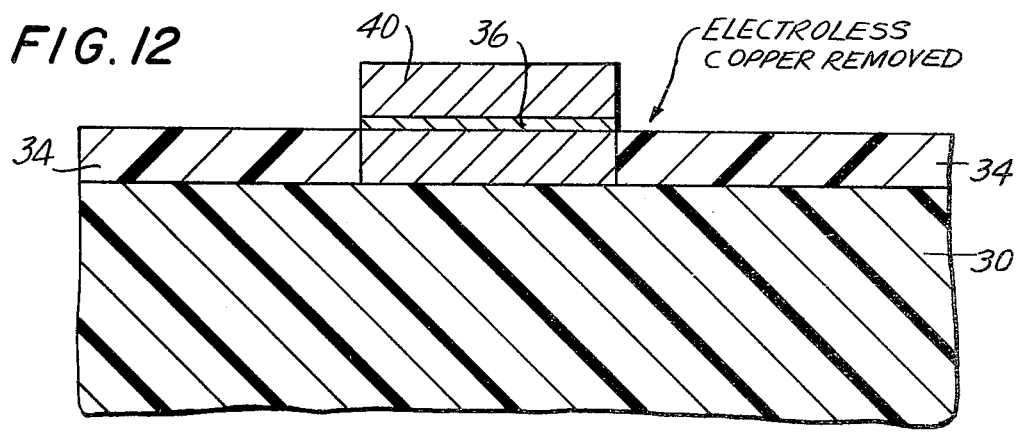
FIG. 12 is a view similar to that of FIG. 11, but illustrating the removal of the thin film of electroless copper of FIG. 8 leaving just the desired conductors.

FIG. 11 is similar to FIG. 10, except that the temporary mask has been removed. Block 4g illustrates this step of the present process. In FIG. 12, the electroless copper has also been removed and block 4h illustrates this step of the invention. The thin film of electroless copper deposited beneath the temporary mask are interim steps in the process of building or forming the conductive levels of circuitry.

Figure 13:
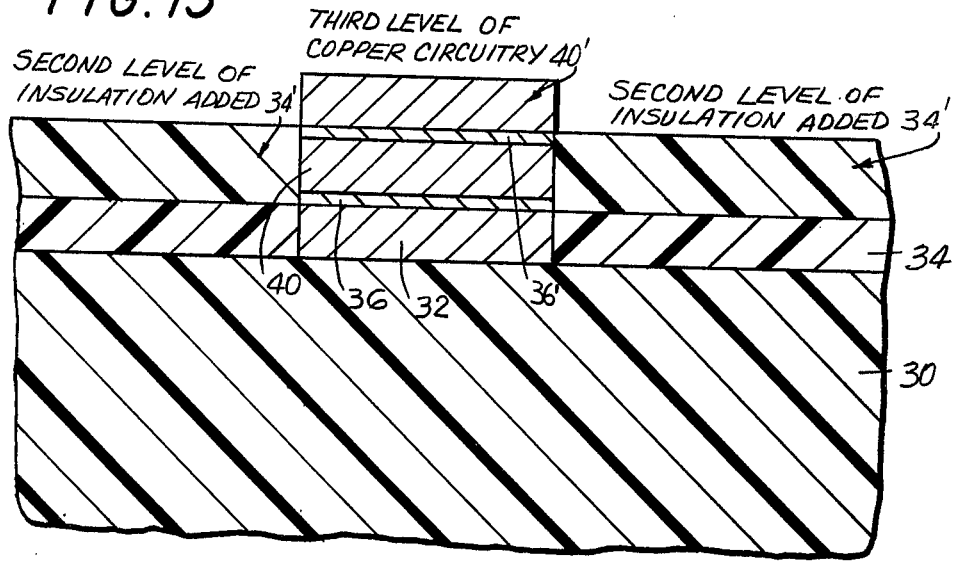
FIG. 13 is a view similar to that of FIG. 12, but illustrating the result of a second sequential build-up of the insulation and copper on the base or substrate using the same identical method steps of FIGS. 7-11, thereby achieving a third level of copper on each side of the base or substrate.

In FIG. 13, a second level of insulation or coating 34' and a third level of circuitry 40' has been formed by repeating the method steps shown and described with respect to blocks 4c-4h of the flow diagram of FIG. 4. Steps 4c-4h, which comprise a level of circuitry, 40'', 40''', 40'''', etc. are repeated as often as required until the last level. Each additional level is formed in the identical manner as any other level.

Figure 14:
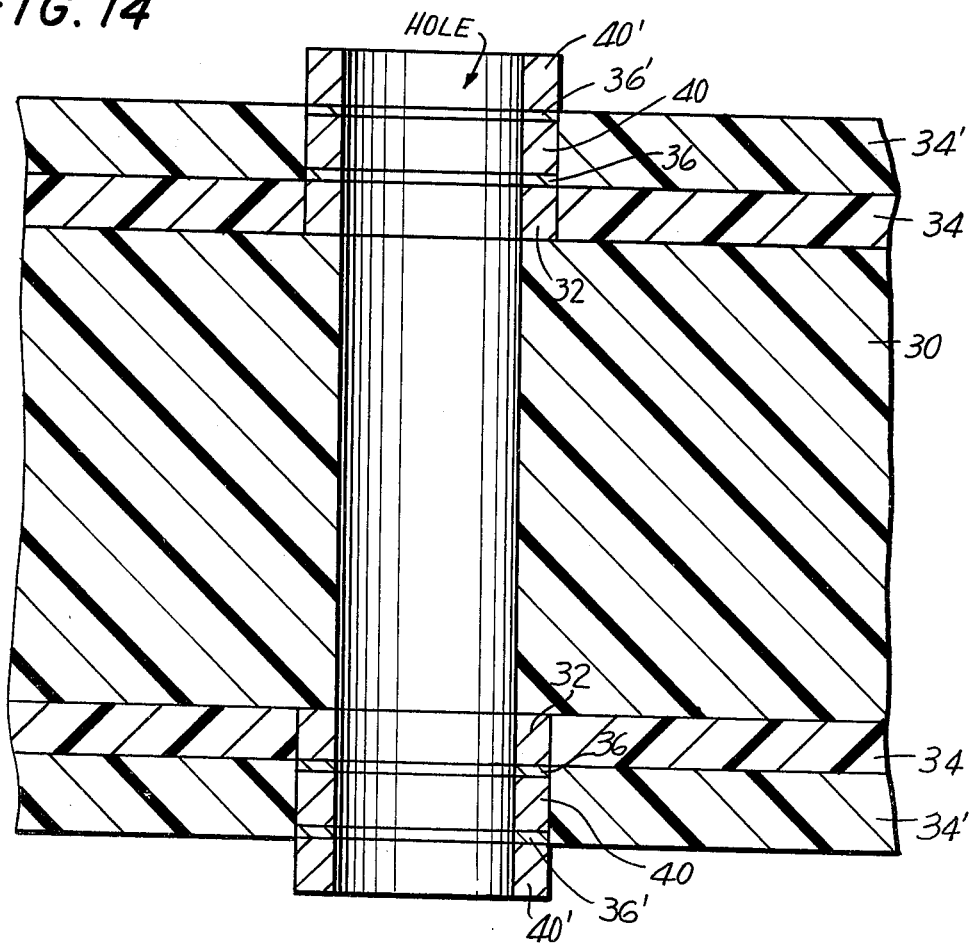
FIG. 14 is a complete cross-sectional view of the base or substrate shown in FIG. 13, but showing a drilled lead hole completely through the circuit board.

The last level of circuitry is not formed until after all necessary holes in the circuit board are first drilled, as shown in FIG. 14 (block 4j of FIG. 4). For example, holes may be required for component mounting and/or for the purposes of interconnecting circuitry on one side of the substrate 30 with circuitry on the other side of the substrate.

Figure 15:
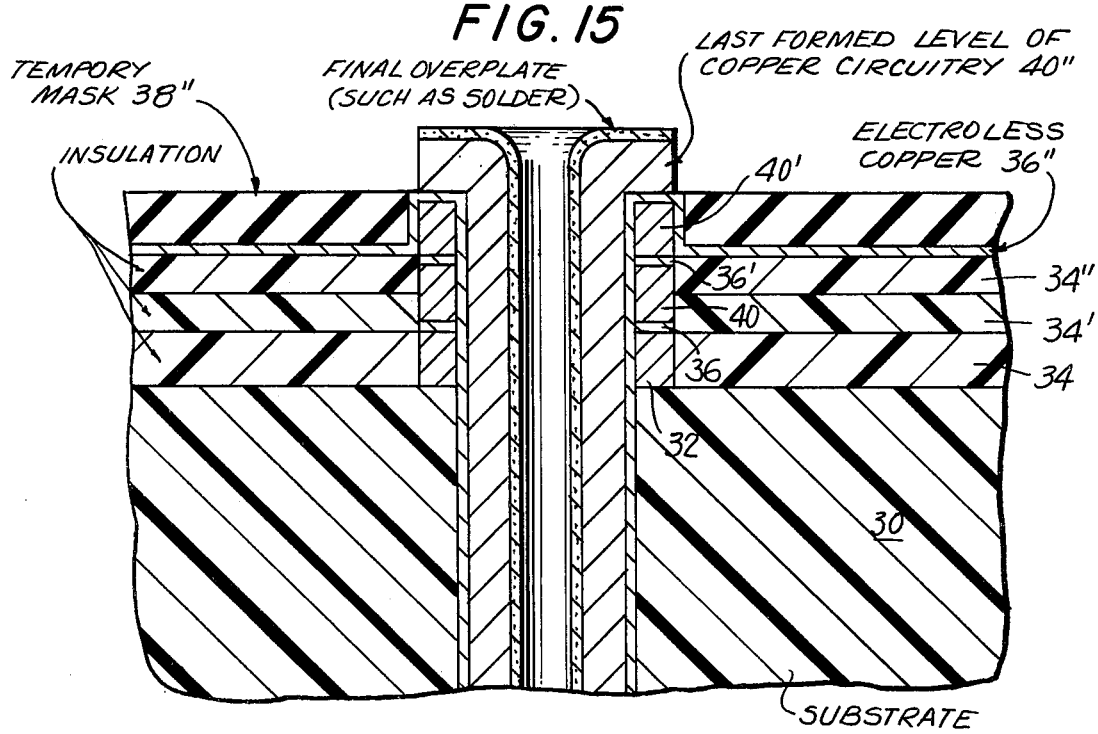
FIG. 15 is a fragmentary cross-sectional view of the lead hole of FIG. 14, but showing the last temporary mask and electroless copper deposits as well as the electroplated copper lead hole with an optional conductive coating to facilitate soldering and/or to achieve a better electrical connection.
Figure 16:
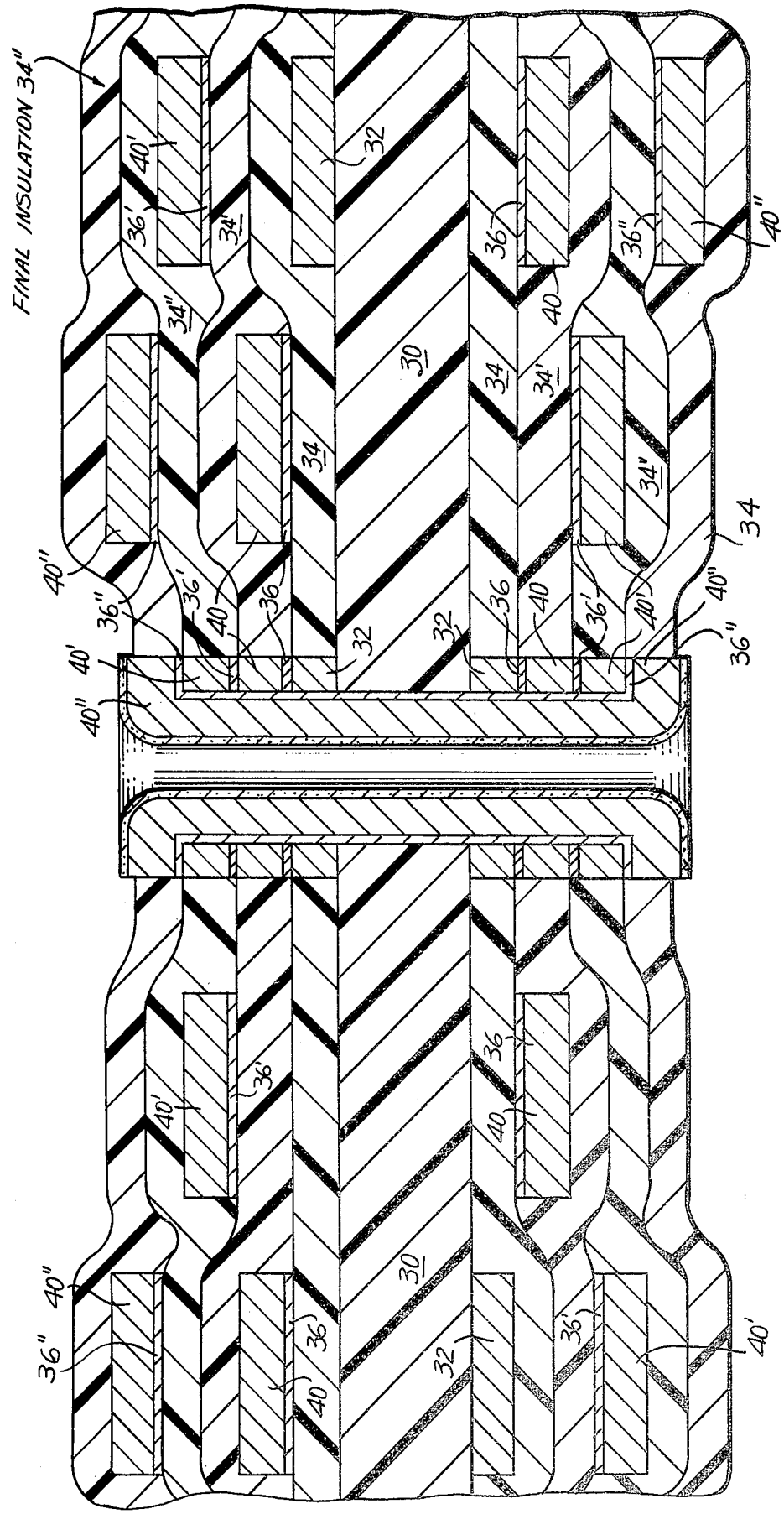
FIG. 16 is a fragmentary cross-sectional view like that of FIG. 15, but showing the final outer insulating layer which replaced the last temporary mask and electroless copper deposits.

In FIG. 15, the very last level of circuitry 40'' is shown formed in further predetermined areas and this level is also achieved or formed using the same method steps 4c-4h, but is shown as a separate step by block k in the flow diagram of FIG. 4. As shown in FIG. 16, the final insulating layer 34''' (on each side) is applied over the last level of formed circuitry 36'' except in still further predetermined areas. This figure shows a typical cross-section through an eight level board (four levels on each side of the substrate 30).

Although it has been indicated that the final finish may be a solder coating, the final finish can also be the actual last level of circuitry which is bare copper. A coating of electroless or electroplated metals, such as tin, nickel, gold, solder, alloys thereof, and the like may be applied over the final level of formed copper circuitry as the final finish. For example, a nickel finish may be desired for welding components in place. Gold may be used for ultrasonic wire bonding of components. Solder may be used for soldering components in place.

A modification of the present invention is shown in FIGS. 7A-9A and illustrated in the flow diagram of FIG. 4A. In this application of the invention, a two-sided plated through hole printed circuit board can be constructed with bare copper circuitry on both sides covered by a soldered mask and only the hole and its pad area around the hole is coated with the solder or with another final finish, such as those noted hereinabove.

Figure 7A:
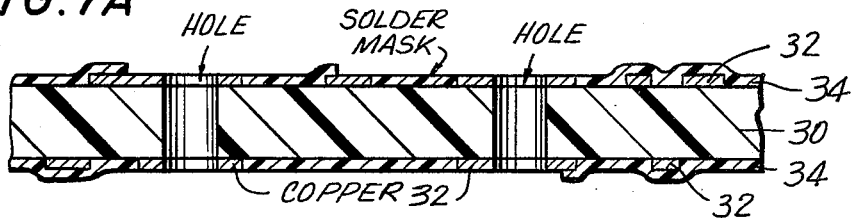
FIG. 7A is an enlarged fragmentary side elevational view in cross-section of a typical base, but showing a pair of holes drilled through two copper built-up areas.
Figure 8A:
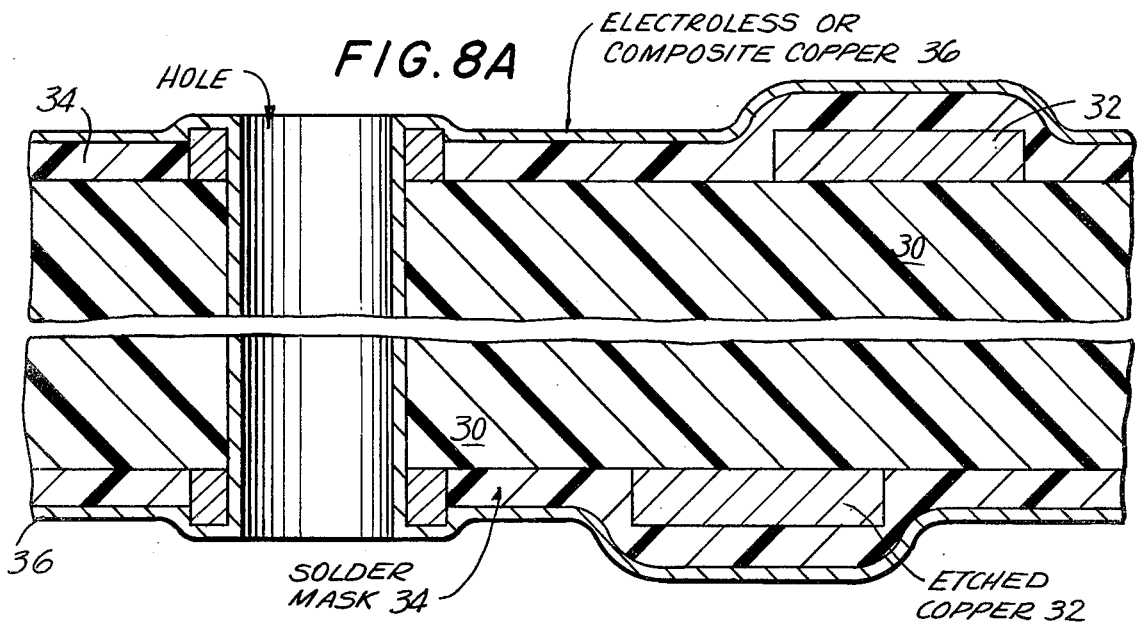
FIG. 8A is a greatly enlarged cross-sectional view of one of the drilled lead holes shown in FIG. 7A, but showing the hole and side surfaces of the base with a subsequent copper coating.
Figure 9A:
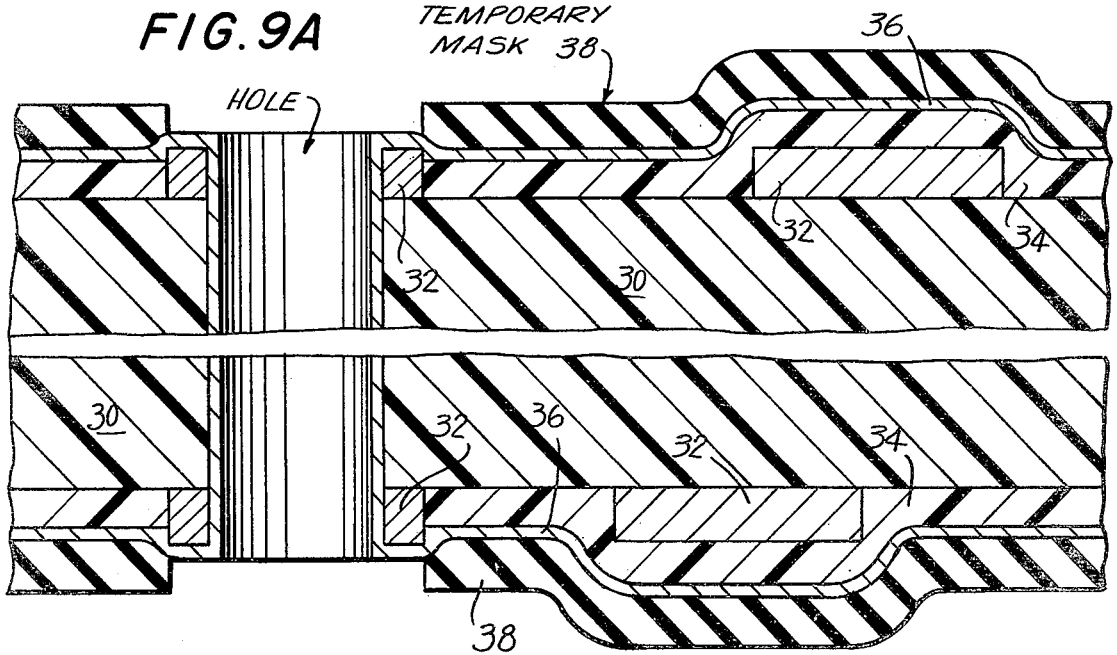
FIG. 9A is a view similar to that of FIG. 8A, but illustrating a temporary mask applied to the last layer of copper.
Figure 9B:
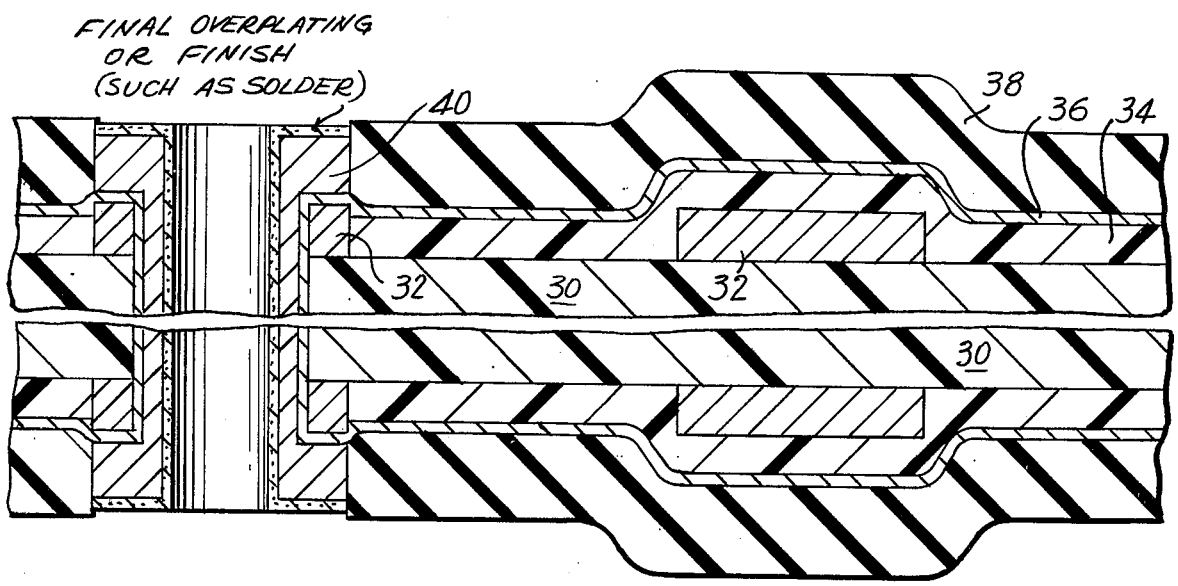
FIG. 9B is a view illustrating both sides of a circuit board, and a drilled hole through a built-up copper terminal pad with an electroplated solder coating.
Figure 9C:
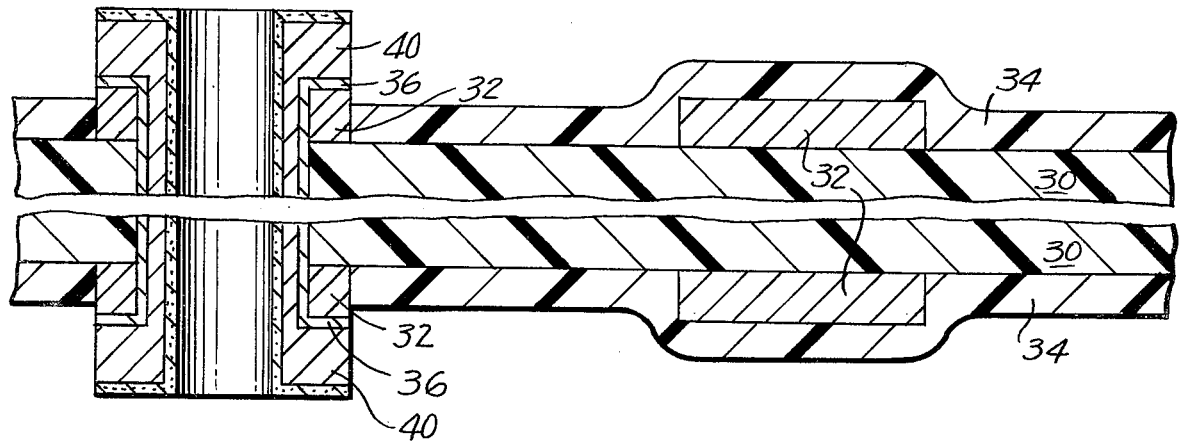
FIG. 9C is a view similar to that of FIG. 9B, but showing the removal of the last temporary mask and the electroless copper deposits.

FIG. 7A shows etched copper conductors (32), and solder mask (insulation 34) applied as required over some circuit areas and allowing certain other areas of copper to be exposed. Holes are also shown at this stage. In effect, the construction shown in these three figures is actually a four-level circuit board with circuitry on the final level as pads only with no interconnecting conductive paths. Thus, no second level of insulation is required. In FIG. 8A, a thin electroless copper or composite copper film is shown on the surface and in the holes (similar to FIG. 8 which represents a case which need not necessarily have any holes). In FIG. 9A a temporary mask 38 is shown over the thin copper layer 36 (identical to FIG. 9). However, this mask 38 allows the formation of only pads around the holes, and does not allow for any interconnecting circuitry as none are required for this type of circuit board structure. A copper coating 40 is formed on the exposed pads and in the holes as shown in FIG. 9B. This copper coating 40 may be coated with a final finish or coating, such as solder or other material, as noted hereinbefore and also shown in FIG. 9B. After the final finish is applied, the temporary mask 38 and the thin copper coating 36 are removed (as shown in FIG. 9C) leaving the underlying solder mask 34 covering the etched copper circuitry 32.

Where a final finish of solder is utilized as a finish coating, then this solder coating may be reflowed if required for conventional reasons in the ordinary utilization of the printed circuit board.

The main advantage of this modification is that it produces a solder mask over circuitry which will not wrinkle or flake off the circuitry since it is applied directly to the original bare copper. This in and of itself is not new, as other manufacturing techniques can also produce such structures. In the most common type of circuit board manufacturing technique, the solder mask is applied over solder coated circuitry. As the solder mask is not capable of adhering to the solder coated circuitry, the solder mask tends to flake off and/or wrinkle in the presence of mask soldering operations. However, there are other manufacturing techniques which are very expensive and complex and involve highly specialized capital equipment, such as hot solder dip with hot oil or air blasting to clear out the holes. With such a hot oil or air blasting procedure, the circuit boards made by such manufacturing technique result in having an exceptionally thin solder coat which is generally insufficient for long-term shelf life. The thin coating of solder is all that is capable of remaining on the copper surfaces and it is thinner than normally required for adequate long-term storage while still being capable of being readily soldered.

Figure 13C:
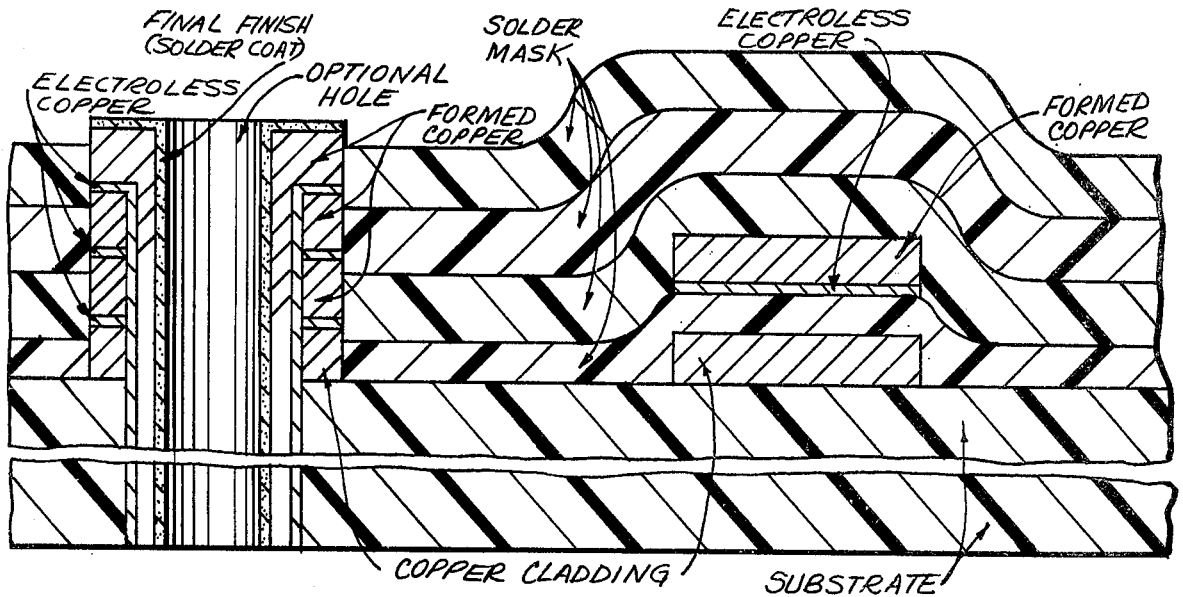
FIG. 13C is a view similar to that of FIG. 13B, but showing a variation where a drilled component lead hole or terminal pad with an electroplated solder coating may be required.
Figure 13A:
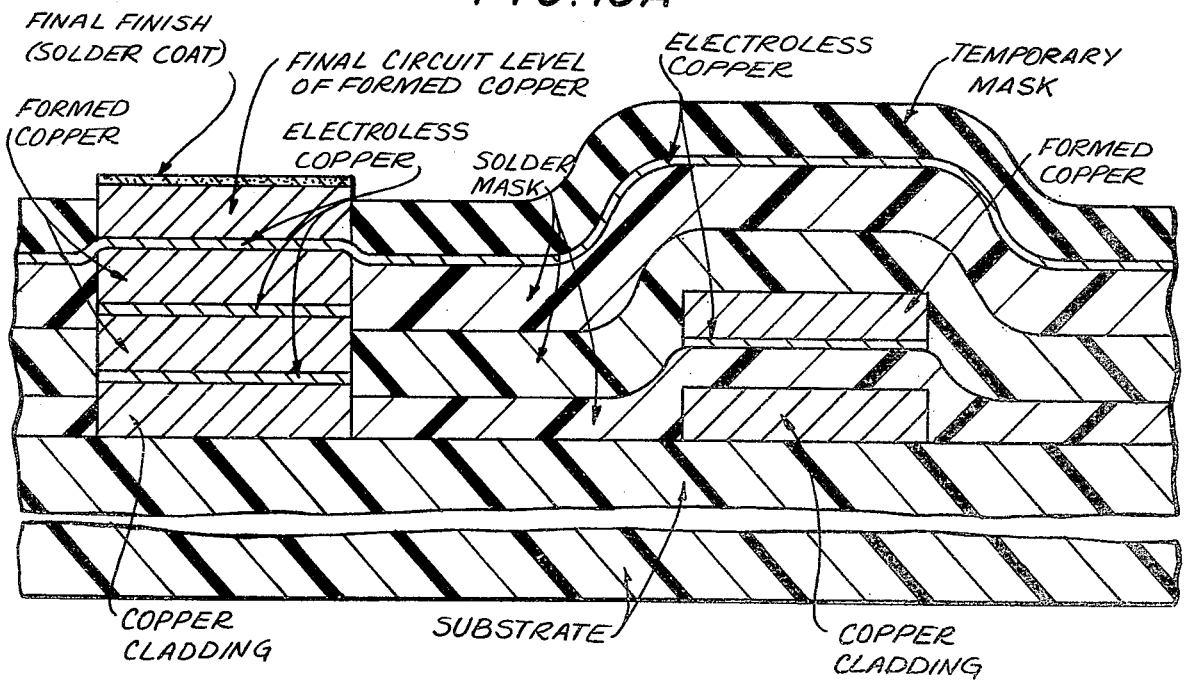
FIG. 13A is a greatly enlarged cross-sectional view of a multi-level circuit device at an interim stage, showing the final electroplated copper and solder coat with the last electroless copper and temporary electroplating mask in place, and wherein basically four copper-to-copper levels are also illustrated as an interconnection joint (replacing a conventional "via hole" or component hole) on a single side of a base or substrate.
Figure 13B:
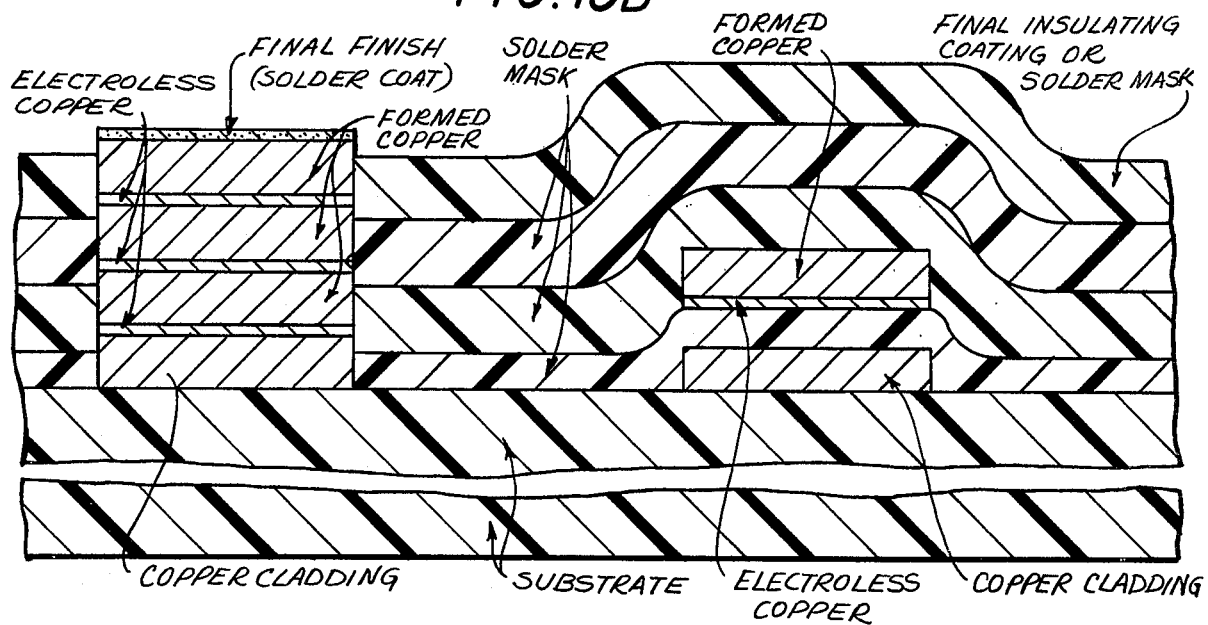
FIG. 13B is a view similar to that of FIG. 13A, except that the temporary electroplating mask and electroless copper have been removed and replaced with the final insulating coating, and wherein the conductors may be randomly disposed on any level and need not necessarily line up with those conductors on another level.

Referring now to FIGS. 13A–13C and their descriptions as noted hereinbefore, these figures illustrate all of the circuit levels on the same side of the printed circuit board which thereby eliminates the requirement for interconnection holes from one side of the substrate to the other. Holes are not required for mounting of components since components can be assembled by the well-known reflow soldering technique. It should be noted that in conventional circuit board manufacture holes are required to interconnect both sides of the substrate and since the holes existed, they were commonly used for the mounting of components, thus serving a dual purpose. The elimination of the holes improves serviceability and repairability, as well as achieving a significant cost reduction of the circuit board. Holes can, of course, be utilized in those areas where they may be desired, such as in special component mounting and for structural reasons, as is best shown in FIG. 13C. By the elimination of component mounting holes, wave soldering and flux cleaning is thereby eliminated, further ensuring a more reliable product, as these steps contain inherent problems, such as bridging shorts, voids, cold solder joints, warped boards, and many other problems which need not be noted herein.

One of the most important aspects of the present invention, besides substantially lowering the cost of a multi-level printed circuit board, is the fact that in the present invention, the copper conductors are bonded layer to layer together to form a solid copper terminal structure. It is this solid copper area which is drilled to provide the holes for the component mounting means. Thus, the metallurgical to metallurgical bond for each copper level in the present invention is far superior and virtually fail-safe in structural integrity as compared to the drilled hole and copper circular tubular interconnecting contact areas for each level of the prior art multi-layer circuit construction.

It should be appreciated that in the manufacture of printed circuit boards of generally any number of levels, there are other minor but detailed conventional process steps which are ordinarily utilized or employed in the manufacture of a printed circuit board that are not described herein as they are not thought to be necessary for an understanding of the invention. These basic steps comprise any number of the following processes, which are not necessarily limiting but may include others, such as cleaning, scrubbing, degreasing, rinsing, pickling, activating, "promoting" and catalyzing.

It should also be noted that due to the build up of the conductors, and the higher build up of the insulation, there would appear a slight depression or build up around each terminal area or terminal pad. This is not in and of itself objectionable, but it can be remedied by providing an optional step in the process to alleviate such depression. Consequently, prior to the removal of the temporary mask, another temporary mask can be put over it which only exposes the terminal pads but not the conductors so as to in effect allow further build up of the thickness of copper in the depression areas up to the level desired or flush with the remaining portion of the conductors. Thereafter, the last temporary mask is removed along with the first temporary mask leaving the electroless copper disposed beneath the first temporary mask as noted hereinabove. These steps thus enable all additional layers to be subsequently provided in a neat manner by using the same identical steps as noted herein until one reaches the desired number of circuit levels, less one. In addition, with respect to the last and final layer, as all drilled holes are provided in the terminal pad areas the electroless copper is not only applied to the surface this time, but also to the inside of the holes which are drilled. The temporary mask is subsequently provided over both sides of the product, and copper is built up inside the holes that are drilled and on the surface areas where the terminals and conductors are required. Thereafter, where desired, solder or gold may be plated on the terminals and conductors should same be required depending upon the application or specifications of the multi-level printed circuit board construction. One of the unique advantages of the method and product of the present invention is that they are more economical than the prior art techniques in that they do not require the use of as many "via" holes. Such via holes are required in conventional multi-layer printed circuit board constructions for enabling interconnecting points without creating additional layers which are costly. In other words, it is sometimes difficult to make a particular electrical connection in prior art printed circuit boards because of the crowded nature of the circuitry. Via holes therefore provide a means or way by which a connection could be made without interfering with any other connection. With the present invention, the same insulating layer tool may be utilized for each layer to be built up. However, in lieu of utilizing via holes, a different tool is used to form the last insulating layer and this insulating layer tool would provide coverage of all interconnections which do not require a drilled hole for other purposes. This feature is extremely important inasmuch as the average circuit board may contain approximately 20% via holes which can be substantial in numbers particularly since a complex board structure could have literally thousands of drilled holes. Such interconnection joints which eliminate the via holes may have analogous appearance to an integrated circuit chip form using solid state technology.

With respect to interconnection joints utilizing holes, the formed copper conductors and/or base copper cladding need not involve all layers. Thus, for example, in a six-level board, only the two outer layers may be formed at the hole and the intermediate and/or clad layers may not exist at the hole. In another situation, the intermediate layer on one side and the clad layer on the opposite side may exist at a hole so long as at least one outer layer also has an appropriate pad for the drilled hole for purposes of an interconnection joint or lead to be connected thereat. The reason why the outer layer or layers must have the formed copper deposit or pad or terminal area is to provide for the subsequent soldering of a lead at such hole which is generally accepted as an industry standard.

Common thicknesses of the various components forming the levels in the multi-level printed circuit boards of the present invention are as follows, but should not be considered limiting in any way. The base laminate is commonly 1/16" thick (0.062), although boards as thin as 1/32 " (0.032) or 3/32" (0.093) have also been used. The most common thickness of the insulation is 0.001. Although the composite copper thickness or copper cladding may vary depending upon the circuit requirements, the most common thicknesses of the copper is from about 0.001" to about 0.002". The solder mask can be thin and commonly ranges from about 0.0005" to about 0.003". With respect to the final solder mask, this is a thinner coating as it is not a dielectric or insulator, but merely a true solder mask or protective coating. The final solder mask thus has no set function in a multi-level circuit board structure, other than, for other reasons, constituting a protective covering or coating.

While the invention has been described, disclosed, illustrated and shown in terms of an embodiment or modification which it has assumed in practice, the scope of the invention should not be deemed to be limited by the precise embodiment or modification herein described, disclosed, illustrated or shown, such other embodiments or modifications as may be suggested to those having the benefit of the teachings herein being intended to be reserved especially as they fall within the scope and breadth of the claims here appended.

What is claimed is:

1. A method for making a multi-level printed circuit board comprising the steps of: forming a first level of circuitry on at least one side of a substrate, applying an insulating covering or layer over the entire surface of said substrate and circuitry except in certain locations where no covering or layer is applied so as to define a first number of predetermined areas, forming a thin adherent conductive coating over all exposed surfaces, applying a temporary mask over the conductive coating except in a second number of predetermined areas, which define a circuit pattern on a second level on said side of said substrate, forming in one step both copper conductive areas including at least some copper circuitry in said second predetermined areas, and where said predetermined areas at any level are coincidental, metallurgical bonds creating interconnections between levels of circuitry; and removing said temporary mask and said adherent conductive coating directly underlying said mask.

2. The method according to claim 1, further comprising forming additional levels of conductive areas and copper circuitry by the same technique that the second level of circuitry is formed; thereby sequentially forming additional levels of circuitry.

3. The method according to claim 2, wherein said conductive areas comprise terminal pads in said circuit board, and said method including for one or more levels of circuitry the additional step of applying an optional temporary mask over said temporary mask so as to only expose the terminal pads but not the copper circuitry, thereby permitting the further build up of the copper to a predetermined desired level, whereby said copper may be built up flush with the remaining portion of the copper circuitry and whereby any depression formed around said terminal pads is alleviated.

4. The method according to claim 3, wherein for each level of circuitry said optional temporary mask is removed at the time the first temporary mask is removed.

5. A method for making a multi-level printed circuit board comprising the steps of: forming a first level of circuitry on each side of a substrate, applying an insulating covering or layer over the entire surface of each side of said substrate and circuitry except in certain locations where no covering or layer is applied so as to define predetermined areas on each side thereof to expose a portion of the underlying circuitry for each of said sides of said substrate, forming a thin adherent conductive coating over said insulating covering or layer and the exposed underlying circuitry on each side of the substrate, applying a temporary mask over the conductive coating except in second predetermined areas, which define a circuit pattern on a second level on said sides of said substrate at this intermediate stage of production, forming in one step both copper conductive areas including at least some copper circuitry in said second predetermined areas on each of said sides, and where said predetermined areas at any level on either side of said substrate are coincidental, metallurgical bonds creating interconnections between levels of circuitry on each side thereof, and removing said temporary mask and said adherent conductive coating directly underlying said mask.

6. The method according to claim 5, further comprising forming additional levels of conductive areas and circuitry by the same technique that the said second level of circuitry is formed, thereby sequentially forming said additional levels of circuitry.

7. The method according to claim 1 or 5, further comprising the steps of providing at least one hole in said multi-level circuit board in at least one of the conductive areas where circuit level to circuit level connections are desired between a plurality of circuit levels, applying an insulating covering or layer except in further predetermined areas, forming a thin adherent conductive coating over all exposed surfaces including the inside of any said hole provided in said multi-level circuit board, applying a temporary mask over the conductive coating except in still further predetermined areas which define the final level of circuitry on at least one of said sides of the multi-level circuit board, removing said temporary mask and said adherent conductive coating, and applying a final insulating coating except in yet still further predetermined areas.

8. The method according to claim 7, including the step of applying a final finish to said final level of circuitry.

* * * * *